(12) United States Patent
Ishikawa et al.

(10) Patent No.: US 6,362,696 B1
(45) Date of Patent: *Mar. 26, 2002

(54) DEVICE WITH A NONRADIATIVE DIELECTRIC WAVEGUIDE WITH COUPLING GAP

(75) Inventors: Youhei Ishikawa; Toru Tanizaki, both of Kyoto; Hiroshi Nishida, Kawanishi, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/618,227

(22) Filed: Jul. 18, 2000

Related U.S. Application Data

(63) Continuation of application No. 09/027,143, filed on Feb. 20, 1998, now Pat. No. 6,218,916, which is a continuation of application No. 08/703,806, filed on Aug. 27, 1996, now Pat. No. 5,825,268, which is a continuation of application No. 08/520,100, filed on Aug. 28, 1995, now abandoned.

(30) Foreign Application Priority Data

Aug. 30, 1994 (JP) .............................................. 6-205425

(51) Int. Cl.$^7$ ................................................ H03B 11/10
(52) U.S. Cl. .................. 331/107 G; 333/248; 333/254; 333/1.1
(58) Field of Search ........................... 331/107 DP, 96, 331/107 G

(56) References Cited

U.S. PATENT DOCUMENTS

| | | | | |
|---|---|---|---|---|
| 4,517,538 A | * | 5/1985 | Stern et al. ................. | 333/254 |
| 5,473,296 A | * | 12/1995 | Ishikawa ................. | 333/248 X |
| 5,604,469 A | * | 2/1997 | Ishikawa et al. ........ | 333/248 X |

* cited by examiner

*Primary Examiner*—Benny Lee
(74) *Attorney, Agent, or Firm*—Ostrolenk, Faber, Gerb & Soffen, LLP

(57) ABSTRACT

A device with a nonradiative dielectric waveguide which operates in a microwave band or in a millimeter wave band. The device with a nonradiative dielectric waveguide is, for example, an oscillator, a circulator, a coupler or the like. The device has a pair of parallel conductors, a dielectric strip which is disposed between the conductors and propagates a high-frequency electromagnetic wave in a specified mode, a mounting surface which is formed on one of the conductors, and an end surface which is defined by an end of each of the conductors so as to be vertical to a traveling direction of the electromagnetic wave propagated in the dielectric strip. An end of the dielectric strip is exposed at a corresponding end surface of the device.

15 Claims, 13 Drawing Sheets

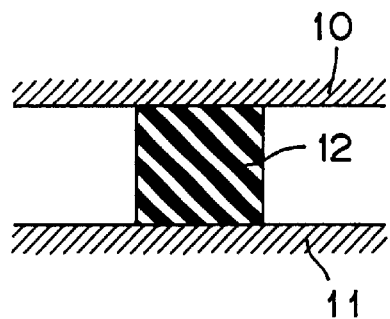
F I G. 2A
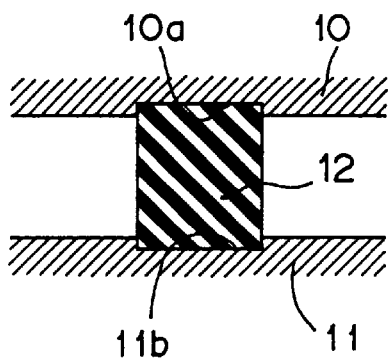
F I G. 2B
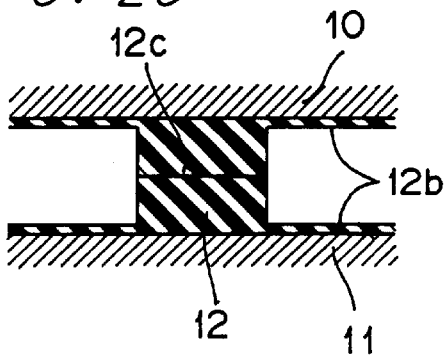
F I G. 2C
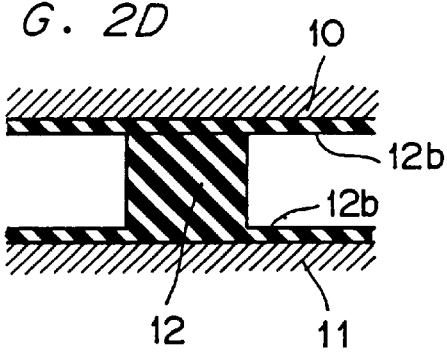
F I G. 2D

F I G. 3A
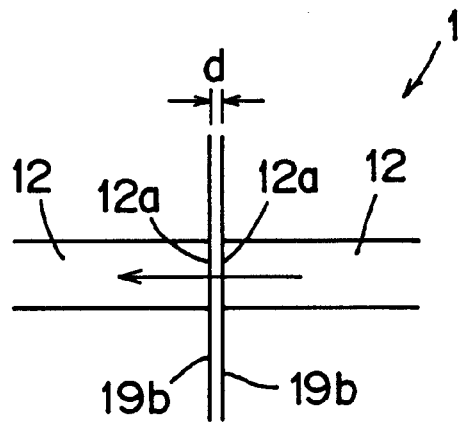
F I G. 3B
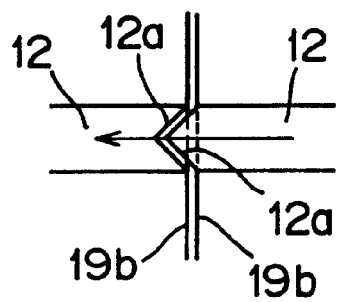
F I G. 3C
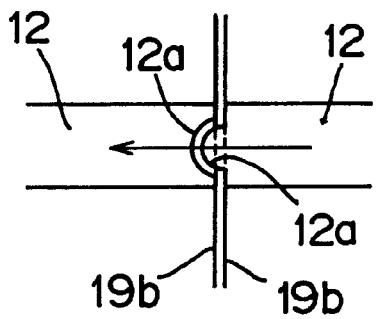

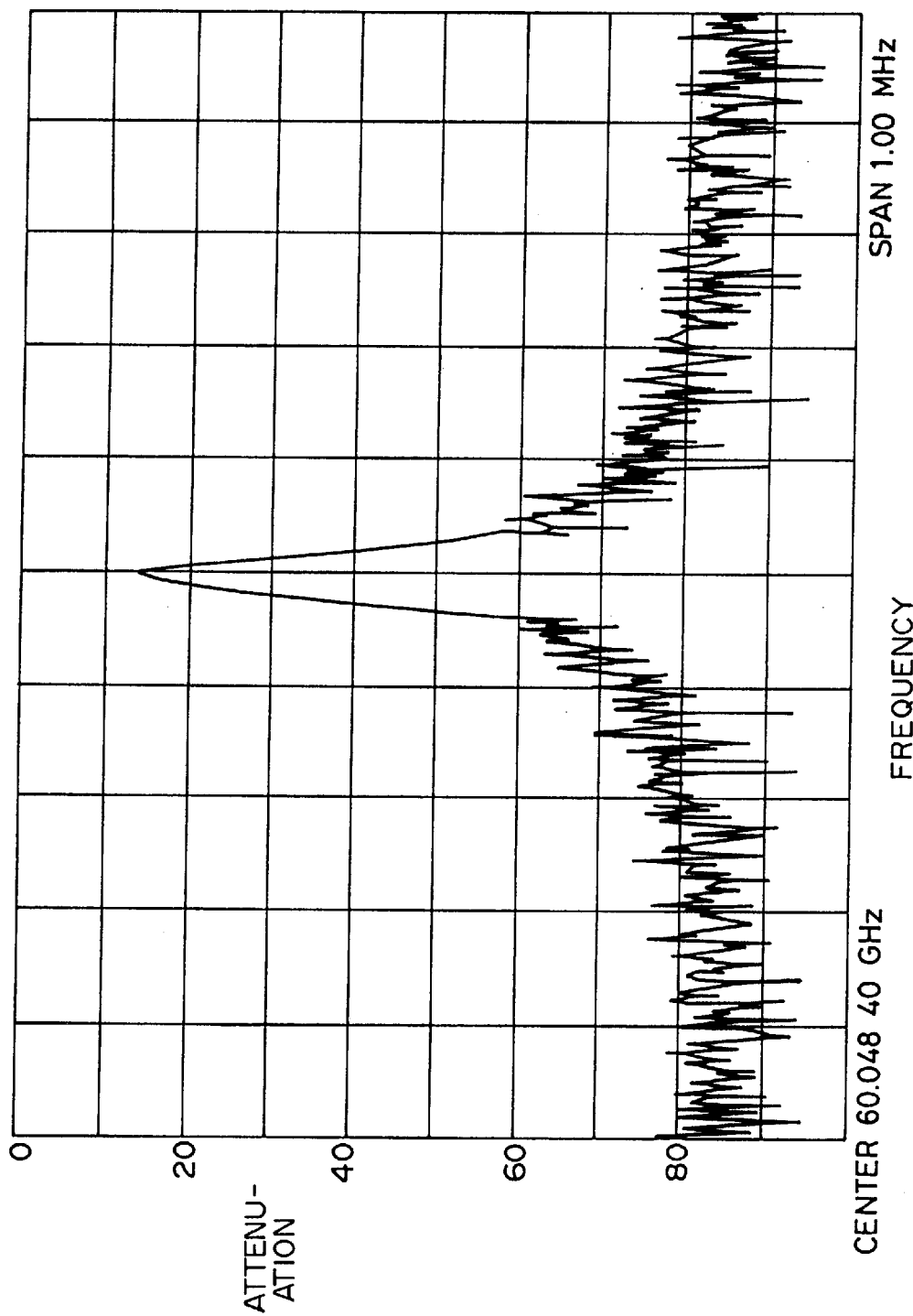
F I G. 4

F I G. 5A
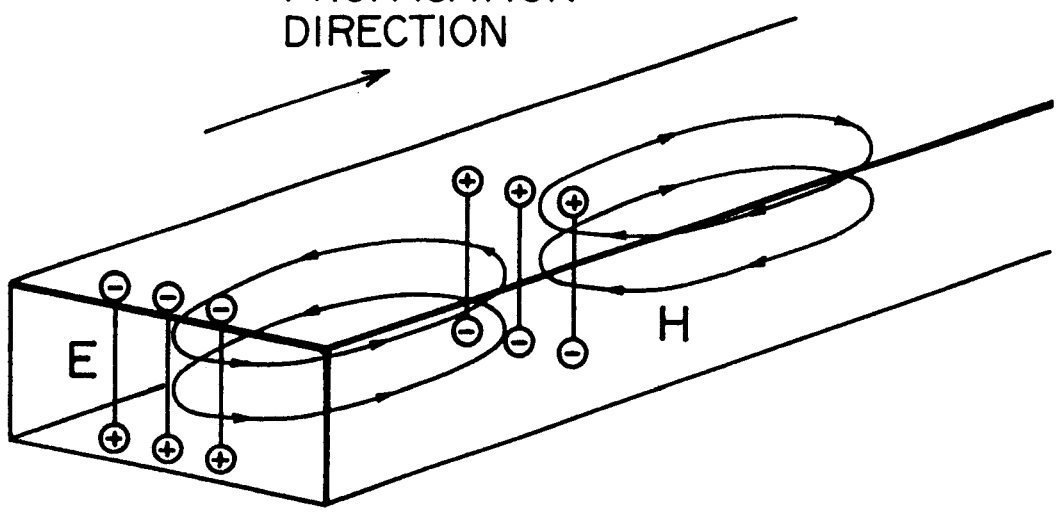
F I G. 5B
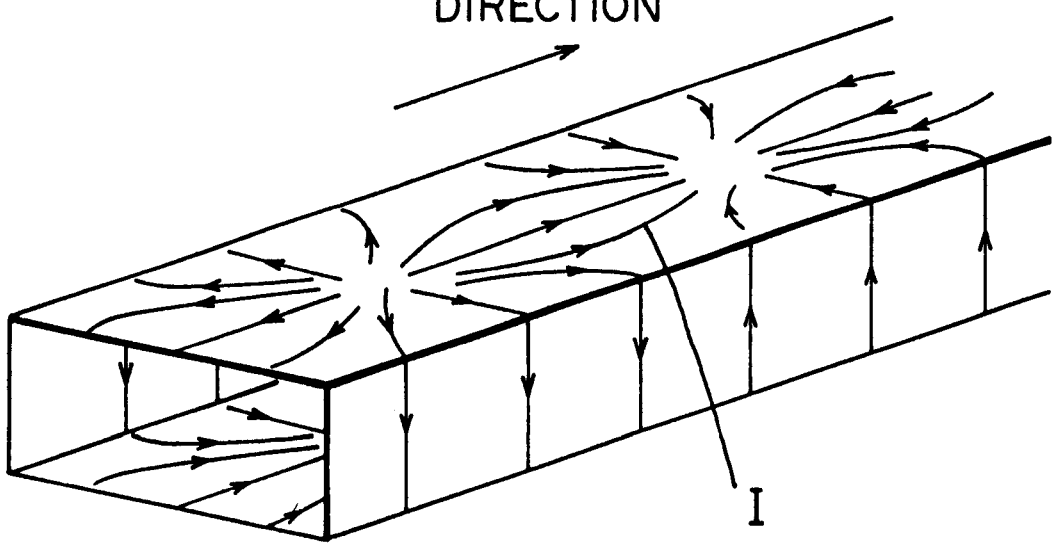

F I G. 10A
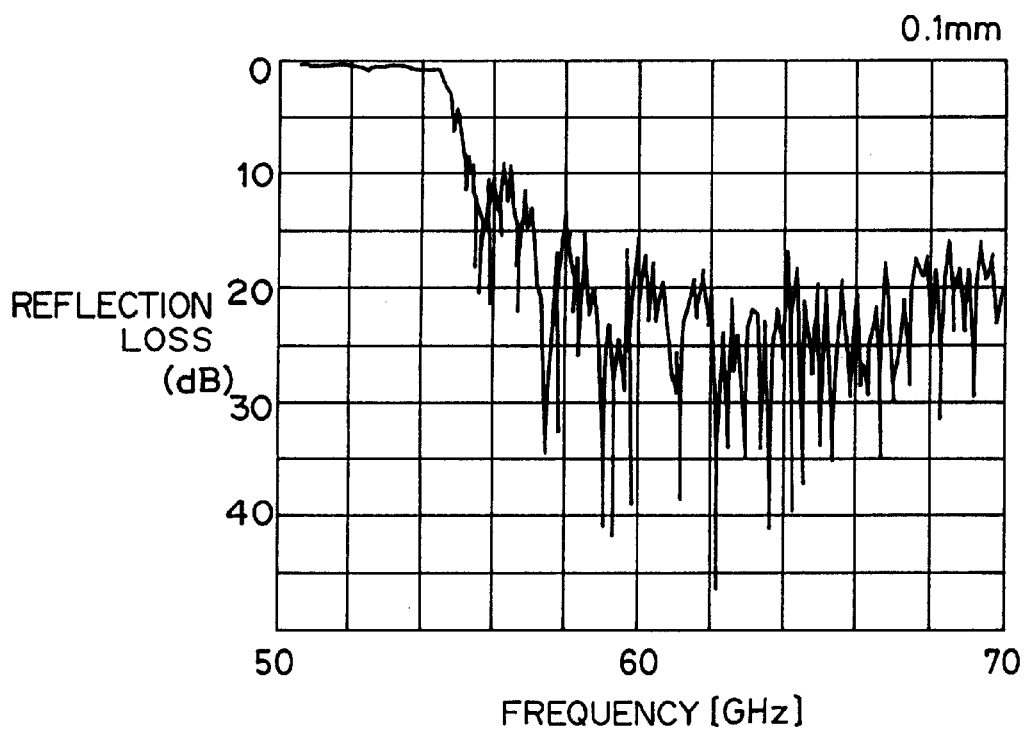
F I G. 10B
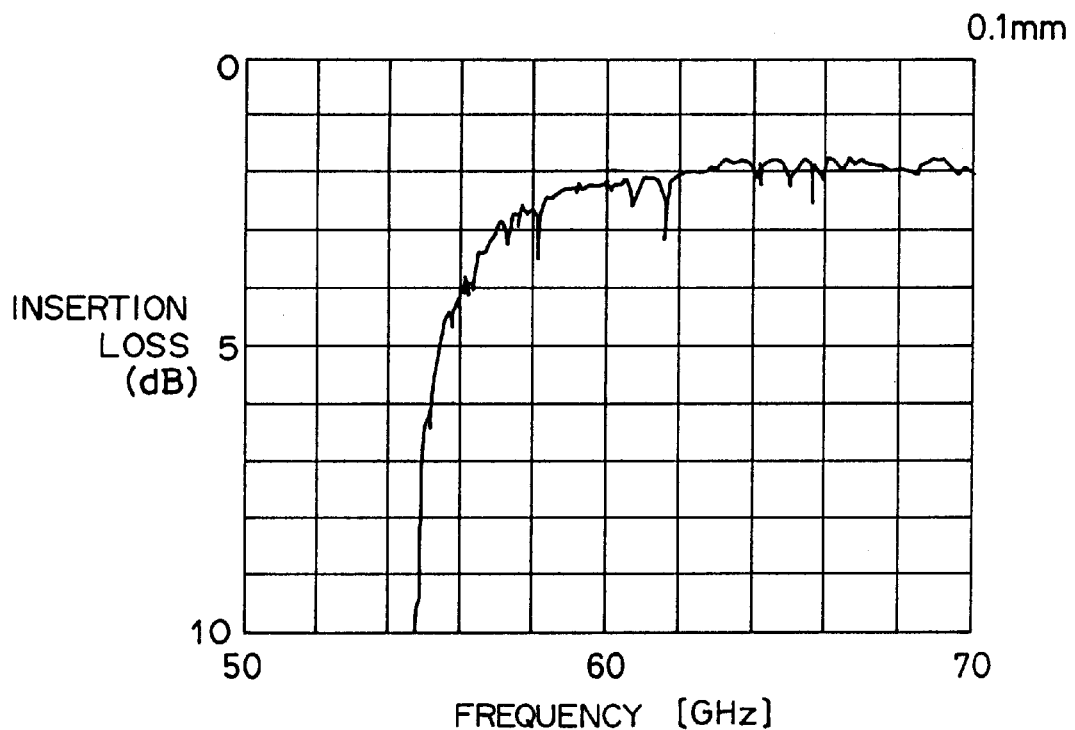

F I G. 11A
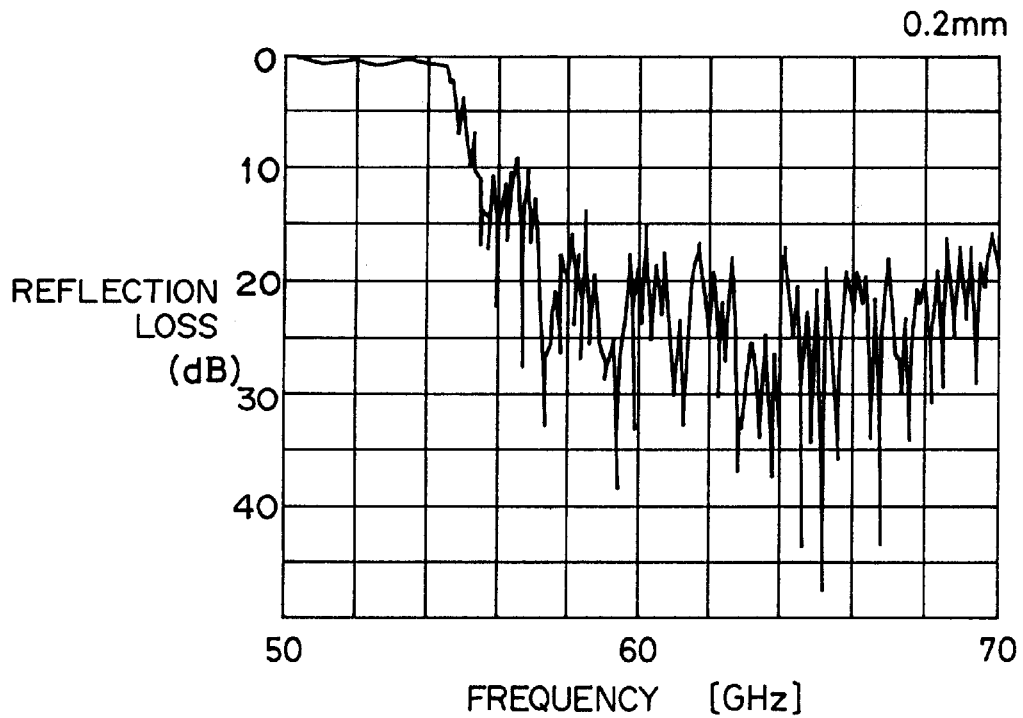
F I G. 11B
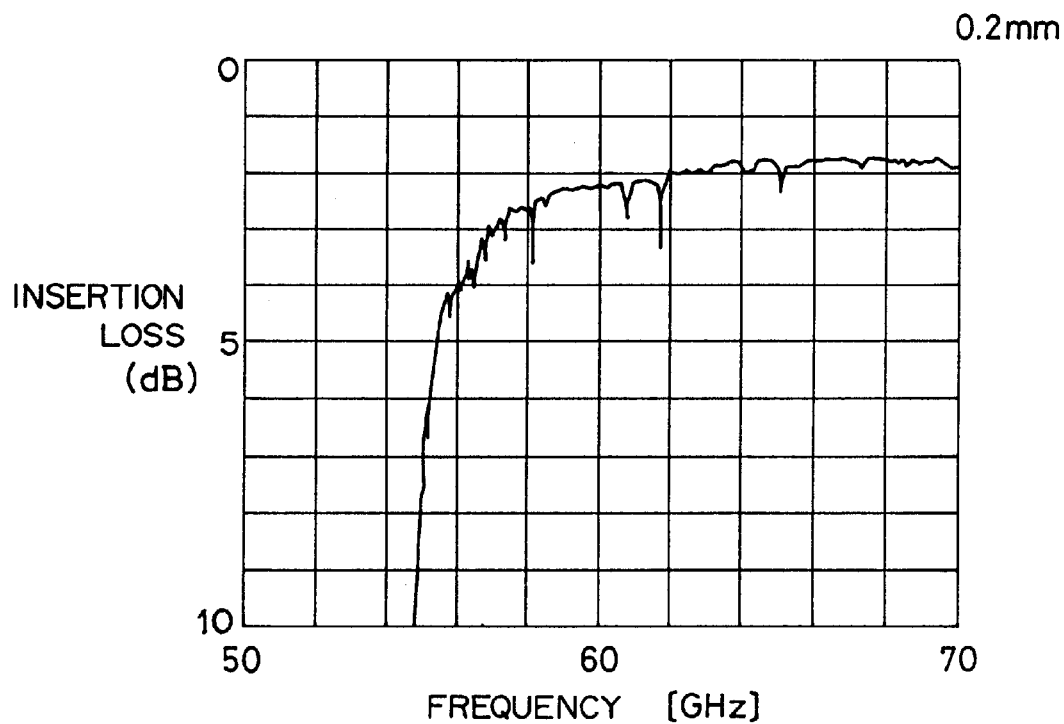

DEVICE WITH A NONRADIATIVE DIELECTRIC WAVEGUIDE WITH COUPLING GAP

This is a continuation of Ser. No. 09/027,143 filed Feb. 20, 1998, now U.S. Pat. No. 6,218,916, which is a continuation of Ser. No. 08/703,806 filed Aug. 27, 1996, now U.S. Pat. No. 5,825,268, which is a continuation of Ser. No. 08/520,100 filed Aug. 28, 1995, abandoned. It is related to copending U.S. Pat. Nos. 5,600,289 issued Feb. 4, 1997, and 5,604,469 issued Feb. 18, 1997.

BACKGROUND OF THE INVENTION

1. Field of the Invention

The present invention relates to a device with a nonradiative dielectric waveguide, and more particularly to a device which has a nonradiative dielectric waveguide and operates in a microwave band or in a millimeter wave band.

2. Description of Related Art

It is well known that dielectric strips are arranged between a couple of conductive plates which are parallel to each other at a specified space to form a nonradiative dielectric waveguide which propagates an electromagnetic wave in LSM01 mode or LSE01 mode. For example, if the dielectric strips are designed to be made of a dielectric material with a dielectric constant ($\in$r) of 2 such as fluororesin and to have a width of 2.5 mm and a height of 2.25 mm, the dielectric strips will form a nonradiative dielectric waveguide which propagates an electromagnetic wave in a band of 60 GHz. When these dielectric strips are put between two conductive plates, an electromagnetic wave which has a wavelength more than twice the height has negligible leakage from the dielectric strips. Therefore, an electromagnetic wave in LSM01 mode or in LSE01 mode is propagated along the dielectric strips without radiating, that is, with a small loss. Thus, such a nonradiative dielectric waveguide is suited to be used as a transmission line of a microwave or a millimeter wave.

Since it is possible to provide magnetic parts and semiconductor chips as well as dielectric strips between a couple of conductive plates, a circulator, an oscillator and the like which have a nonradiative dielectric waveguide can be formed. In this way, a high-frequency integrated circuit which operates in a microwave band or in a millimeter wave band can be produced.

In producing such a high-frequency integrated circuit, conventionally, testing is first carried out. For example, in producing an FM-CW radar, dielectric strips, magnetic parts and semiconductor chips are arranged between a couple of conductive plates which are designed for evaluation, to form a circulator, an oscillator and so on. The conductive plates are connected to an evaluation terminal, and the characteristics of the whole circuit which is composed of the circulator, the oscillator, etc. are measured. Then, the dielectric strips, the magnetic parts and the semiconductor chips are dismounted from the conductive plates and these parts are rearranged between another couple of conductive plates to produce an integrated circuit.

However, in this method, it is difficult to rearrange the circulator, the oscillator, etc. in the same way to reproduce an integrated circuit with the characteristics as measured. In this method, it is impossible to evaluate and adjust the circulator, the oscillator, etc. individually. Therefore, the mass productivity of the integrated circuit is not good. Further, when the integrated circuit has a failure or malfunction, and a part of the integrated circuit, for example, the circulator or the oscillator is exchanged, that change of the part may influence the whole circuit.

SUMMARY OF THE INVENTION

An object of the present invention is to provide a device with a nonradiative dielectric waveguide which is suited for mass production.

In order to attain the object, a device with a nonradiative dielectric waveguide according to the present invention comprises: a pair of conductors which are parallel to each other at a specified spacing; a dielectric strip which is disposed between the pair of conductors; a plane mounting surface which is formed on at least one of the conductors; and an end surface which is formed on an end of the conductors so as to be vertical to a direction in which an electromagnetic wave is propagated in the dielectric strip, an end of the dielectric strip being exposed at the end surface.

Such devices with a nonradiative dielectric waveguide which have the above structure can be produced and evaluated separately. After the evaluation, the devices are mounted on a substrate one by one to produce a high-frequency integrated circuit. Further, if necessary, the devices can be dismounted from the substrate separately.

BRIEF DESCRIPTION OF THE DRAWINGS

This and other objects and features of the present invention will be apparent from the following description with reference to the accompanying drawings, in which:

FIG. 2A is an enlarged sectional view of a dielectric strip and conductive plates of the oscillator of FIG. 1A, taken along a line IIA—IIA in FIG. 1A;

FIG. 2B is a sectional view of the oscillator showing a modification of the dielectric strip between the conductive plates;

FIG. 2C is a sectional view of the oscillator showing another modification of the dielectric strip between the conductive plates;

FIG. 2D is a sectional view of the oscillator showing another modification of the dielectric strip between the conductive plates;

FIG. 3A is an internal plan view of a connecting portion between a dielectric strip of the oscillator and a dielectric strip of another device with a nonradiative dielectric waveguide;

FIG. 3B is an internal plan view of a modification of the connecting portion between the dielectric strip of the oscillator and the dielectric strip of other device;

FIG. 3C is an internal plan view of another modification of the connecting portion between the dielectric strip of the oscillator and the dielectric strip of other device;

FIG. 4 is a graph which shows an oscillation characteristic of the oscillator;

FIG. 5A is a distribution chart which shows an electric field and a magnetic field of an electromagnetic wave which is propagated in a metal tubular waveguide in TE10 mode;

FIG. 5B is a distribution chart which shows a surface current of the electromagnetic wave which is propagated in the metal tubular waveguide in TE10 mode;

FIG. 10A is a graph which shows a reflection loss characteristic of the oscillator when only the conductive plates have a gap of 0.1 mm;

FIG. 10B is a graph which shows an insertion loss characteristic of the oscillator when only the conductive plates have a gap of 0.1 mm;

FIG. 11A is a graph which shows a reflection loss characteristic of the oscillator when only the conductive plates have a gap of 0.2 mm;

FIG. 11B is a graph which shows an insertion loss characteristic of the oscillator when only the conductive plates have a gap of 0.2 mm;

DETAILED DESCRIPTION OF THE PREFERRED EMBODIMENTS

Figure 1A:
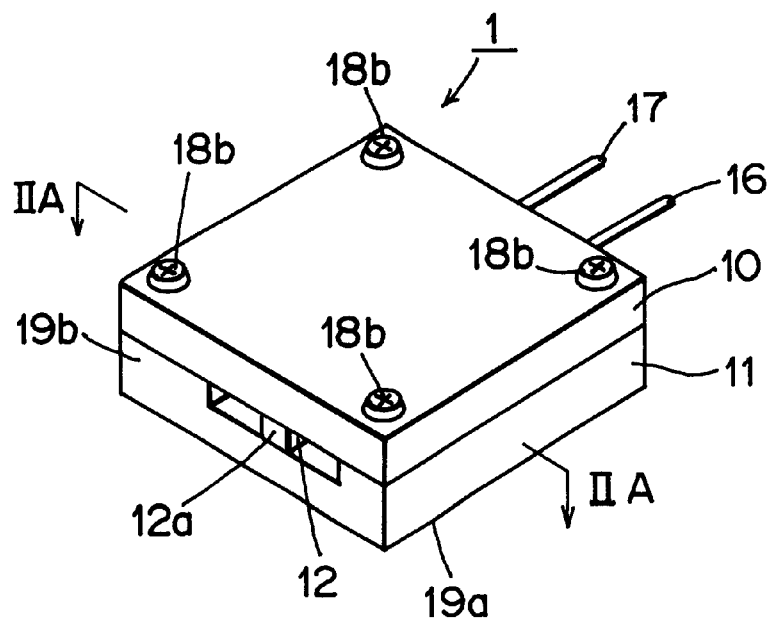
FIG. 1A is a perspective view of an oscillator which is an embodiment of the present invention.
Figure 1B:
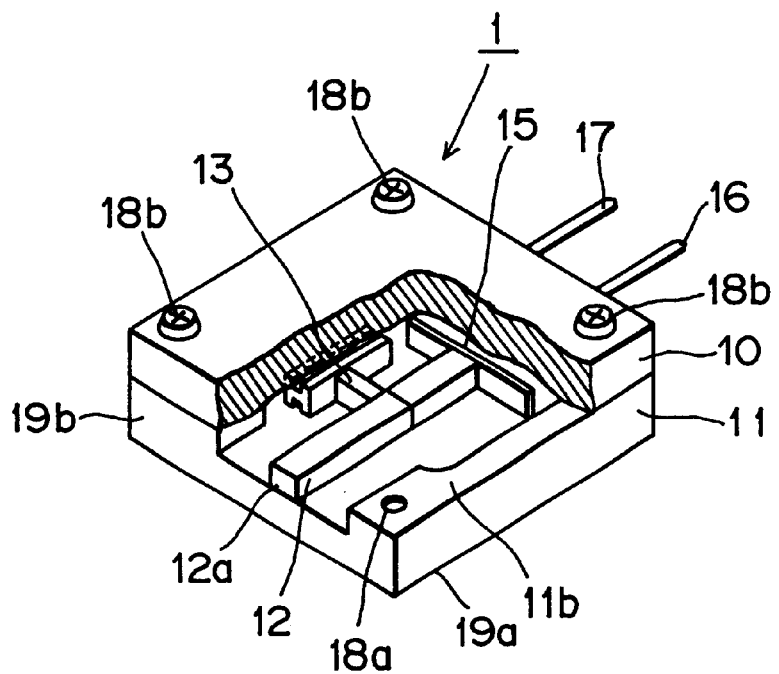
FIG. 1B is a partially cutaway perspective view of the oscillator of FIG. 1A.

Exemplary devices with a nonradiative dielectric waveguide according to the present invention are described with reference to the accompanying drawings in which like references and legends denote like elements and parts. FIGS. 1A and 1B show the structure of an oscillator 1 which is an embodiment of the present invention. The oscillator 1 is employed in a high-frequency integrated circuit which operates in a millimeter wave band, for example, in a high frequency section of an FM-CW radar.

The oscillator 1 comprises a couple of rectangular conductive plates 10 and 11, a dielectric strip 12, a Gunn diode 13 (see FIG. 1B) and a varactor diode 15 (see FIG. 1B) which are disposed between the conductive plates 10 and 11, a power terminal 16 for supplying a direct current to the Gunn diode 13 and a modulating terminal 17 for sending a modulation signal to the varactor diode 15.

The conductive plates 10 and 11 are made of conductive material such as aluminum, copper and the like. The conductive plate 11 has spacers 11b (see FIG. 1B) for keeping the space from the conductive plate 10 at a specified height. The dielectric strip 12, as an example, is made of a dielectric material with a dielectric constant ($\in$r) of 2 such as fluororesin, and is designed to have a height a of 2.25 mm and a width [b] of 2.5 mm. The conductive plates 10 and 11 have tapped holes 18a (see FIG. 1B) at the respective four corners. By tightening screws 18b into the tapped holes 18a, the dielectric strip 12, the Gunn diode 13 and the varactor diode 15 are fixed between the conductive plates 10 and 11.

FIG. 2A shows a way of positioning the dielectric strip 12 between the conductive plates 10 and 11. The dielectric strip 12 is nipped between the conductive plates 10 and 11. The dielectric strip 12 may be attached on the conductive plate 11 by an adhesive so as to be unmovable. Other ways of positioning the dielectric strip 12 are possible as illustrated in FIGS. 2B, 2C and 2D.

In FIG. 2B, the conductive plates 10 and 11 have grooves 10a and 11b, respectively, and the dielectric strip 12 is placed in the grooves 10a and 11b. In FIG. 2C, the dielectric strip 12 has upper and lower strip portions which contact each other at an interface 12c and are connected with respective flanges 12b on the upper and lower sides. In FIG. 2D, the dielectric strip 12 has a flange 12b on the lower side, and the upper conductive plate 10 has a flange 12b.

As shown in FIG. 1A, the conductive plate 11 has a plane mounting surface 19a on the lower side. The laminated conductive plates 10 and 11 have an end surface 19b at which an end 12a of the dielectric strip 12 shows, and the end surface 19b is vertical to a direction in which a high-frequency electromagnetic wave outputted from the end 12a of the dielectric strip 12 travels.

FIG. 3A is a plan view of a connecting portion between the dielectric strip 12 of the oscillator 1 and a dielectric strip 12 of another device with a nonradiative dielectric waveguide, that is, the exposed end 12a of the dielectric strip 12 of the oscillator and an exposed end 12a of the dielectric strip 12 of another device. The ends 12a of the dielectric strips 12 are vertical to a direction in which an electromagnetic wave is propagated and are on a level with the respective end surfaces 19b of the oscillator 1 and the other device. The ends 12a are electromagnetically in contact with each other. The electromagnetic connection between the dielectric strips 12 is possible in other ways as illustrated in FIGS. 3B and 3C.

In FIG. 3B, the ends 12a of the dielectric strips 12 are wedges which engage with each other. One of the ends 12a is slightly protruded from the end surface 19b. In FIG. 3C, the ends 12a of the dielectric strips 12 are round and engage with each other, and one of the ends 12a is slightly protruded from the end surface 19b. As in the cases of FIGS. 3B and 3C, the ends 12a of the dielectric strips 12 do not have to be vertical to the electromagnetic wave propagation direction as long as the ends 12a engage with each other. It is also possible for the ends 12a which are vertical to the electromagnetic wave propagation direction to be slightly protruded from the respective end surfaces 19b and put into eleccteomagnetic contact with each other.

Next, the action of the oscillator 1 is described with respect to FIGS. 1A, 1B. When a direct current is supplied to the power terminal 16 and a modulation signal is sent to the modulating terminal 17, a modulated high-frequency electromagnetic wave is inputted from the Gunn diode 13 into the dielectric strip 12. Suppose that the space between the conductive plates 10 and 11 is a and the electromagnetic wave has a wavelength of λ. If a <λ/2, the electromagnetic wave which is propagated in a parallel direction to the conductive plates 10 and 11 does not leak from the dielectric strip 12. The electromagnetic wave is propogated in the dielectric strip 12 and is outputted through the end 12a. Possible transmission modes of an electromagnetic wave in a nonradiative dielectric waveguide are generally LSE mode and LSM mode. In order for a small loss, LSM01 mode which is the lowest mode of LSM mode is usually used.

The inventors evaluated the oscillator 1 by using a measuring jig and a spectrum analyzer. FIG. 4 is a graph showing the oscillation characteristic of the oscillator 1. As is apparent from the graph of FIG. 4, an oscillation signal which has a resonance frequency of about 60 GHz and has a good waveform was outputted from the end 12a of the dielectric strip 12.

Figure 6A:
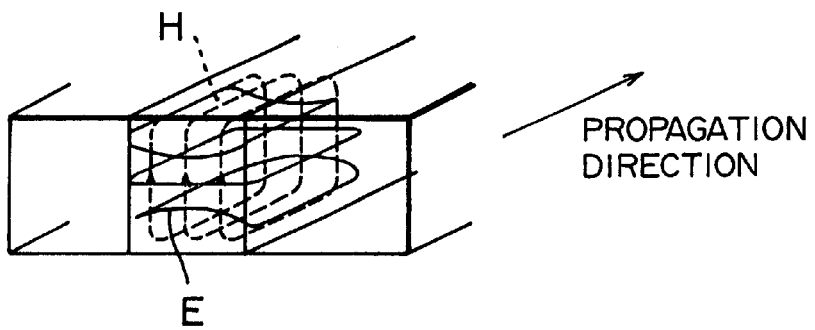
FIG. 6A is a distribution chart which shows an electric field and a magnetic field of an electromagnetic wave which is propagated in a nonradiative dielectric waveguide in LSM01 mode.
Figure 6B:
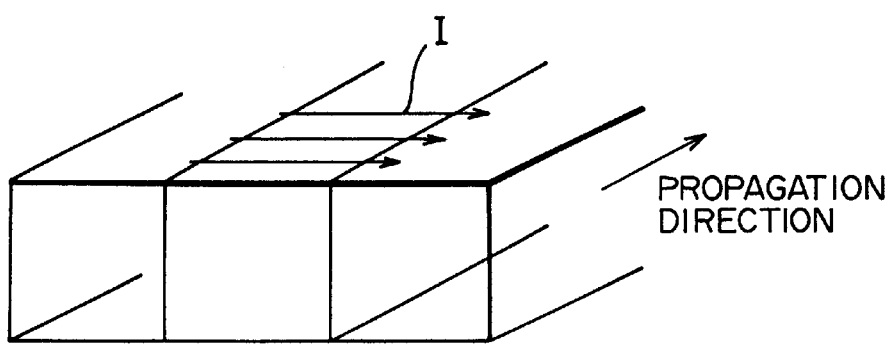
FIG. 6B is a distribution chart which shows a surface current of the electromagnetic wave which is propagated in the nonradiative dielectric waveguide in LSM01 mode.
Figure 6C:
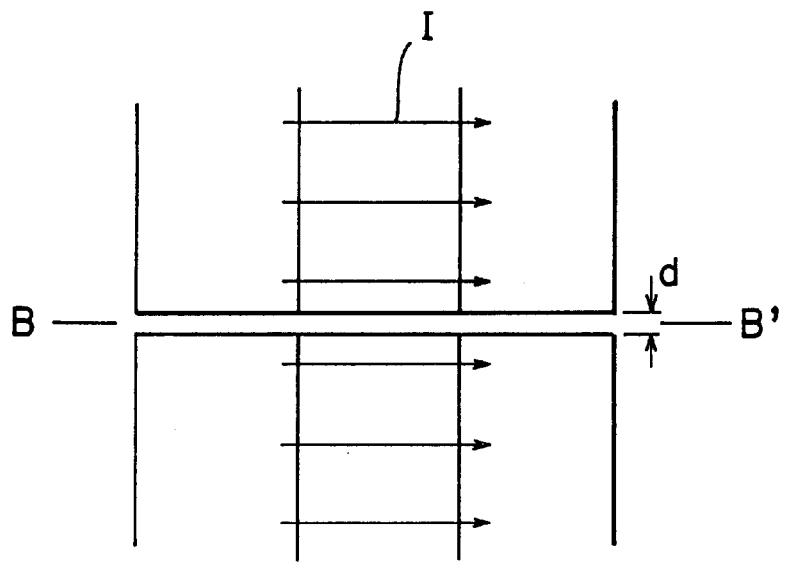
FIG. 6C is a plane distribution chart which shows the surface current of the electromagnetic wave when the nonradiative dielectric waveguide is cut off at a line B—B'.

Now, the difference between an electromagnetic wave propagated in a metal tubular waveguide and an electromagnetic wave propagated in a nonradiative dielectric waveguide is described. FIGS. 5A and 5B show an electromagnetic wave propagated in a metal tubular waveguide in TE10 mode. FIG. 5A shows the electric field E and the magnetic field H of the electromagnetic wave, and FIG. 5B shows the surface current I. FIGS. 6A, 6B and 6C show an electromagnetic wave propagated in a nonradiative dielectric waveguide in LSM01 mode. FIG. 6A shows the electric field E and the magnetic field H of the electromagnetic wave, and FIGS. 6B and 6C show the surface current I. FIG. 6C shows a state wherein the nonradiative dielectric waveguide is cut off at a line B–B'.

As is apparent from FIG. 5B, the surface current I of an electromagnetic wave propagated in a metal tubular waveguide has a component in the electromagnetic wave propagation direction. Therefore, in connecting the metal tubular waveguide to another metal tubular waveguide, the waveguides must be joined firmly without space by a flange. Otherwise, the surface current I will not flow from one of the waveguides to the other waveguide.

On the other hand, the surface current I of an electromagnetic wave propagated in a nonradiative dielectric waveguide in LSM01 mode, as is apparent from FIG. 6B, has only a component in a direction perpendicular to the electromagnetic wave propagation direction. Therefore, even if the conductive plates and the dielectric strip of the nonradiative dielectric waveguide are cut off perpendicularly to the electromagnetic wave propagation direction, that is, even if the nonradiative dielectric waveguide has a gap, the gap will not influence transmission of the electromagnetic wave.

Figure 7A:
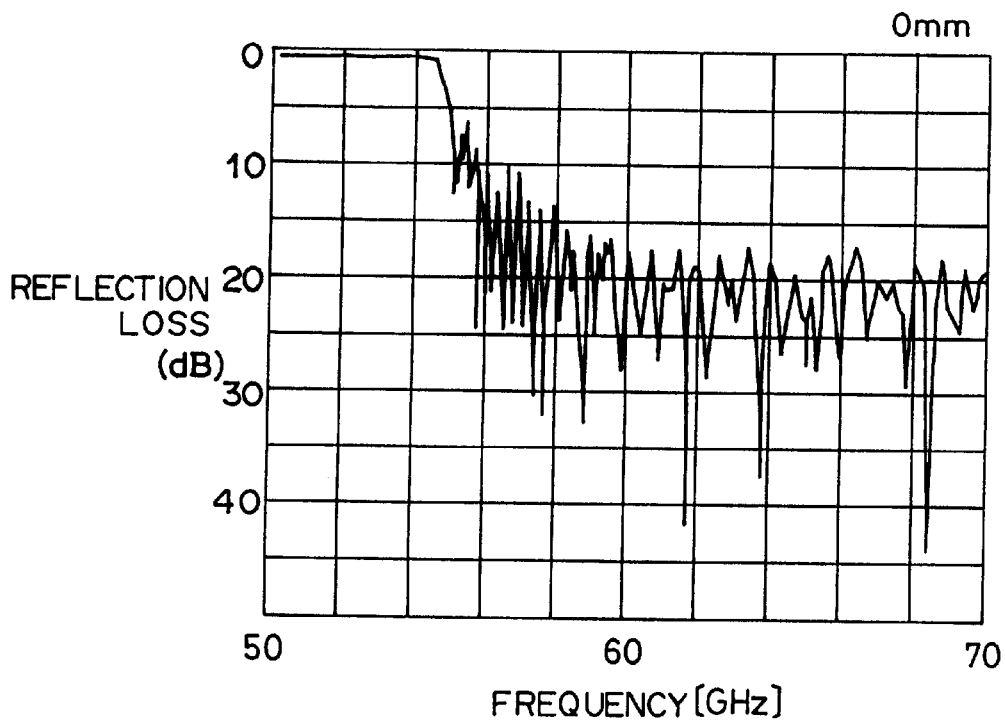
FIG. 7A is a graph which shows a reflection loss characteristic of the oscillator when the conductive plates and the dielectric strip have a gap of 0.
Figure 7B:
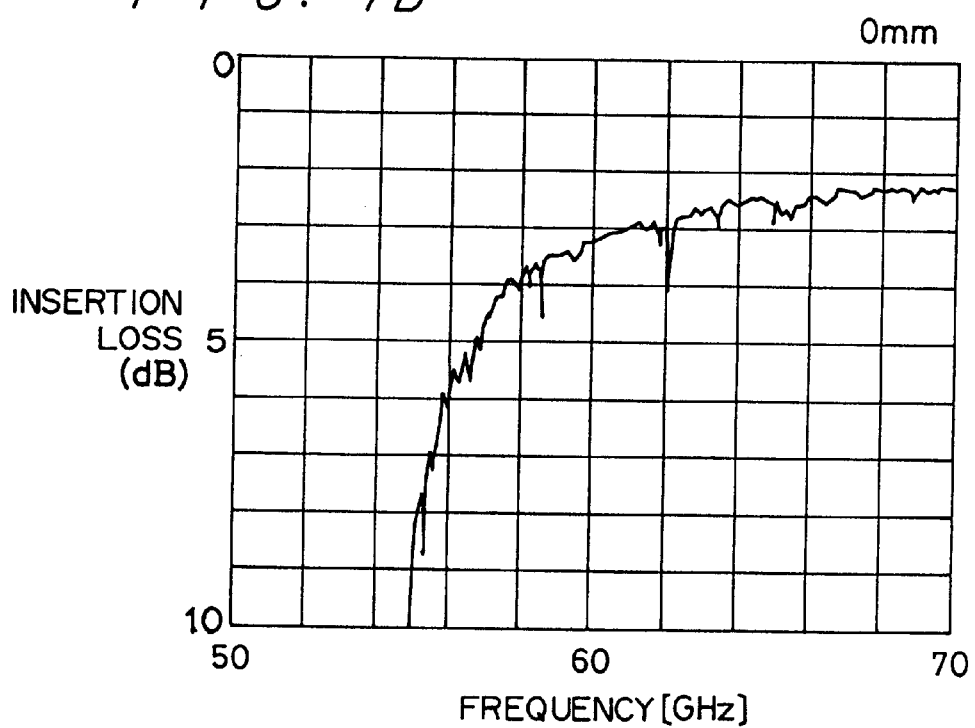
FIG. 7B is a graph which shows an insertion loss characteristic of the oscillator when the conductive plates and the dielectric strip have a gap of 0.
Figure 8A:
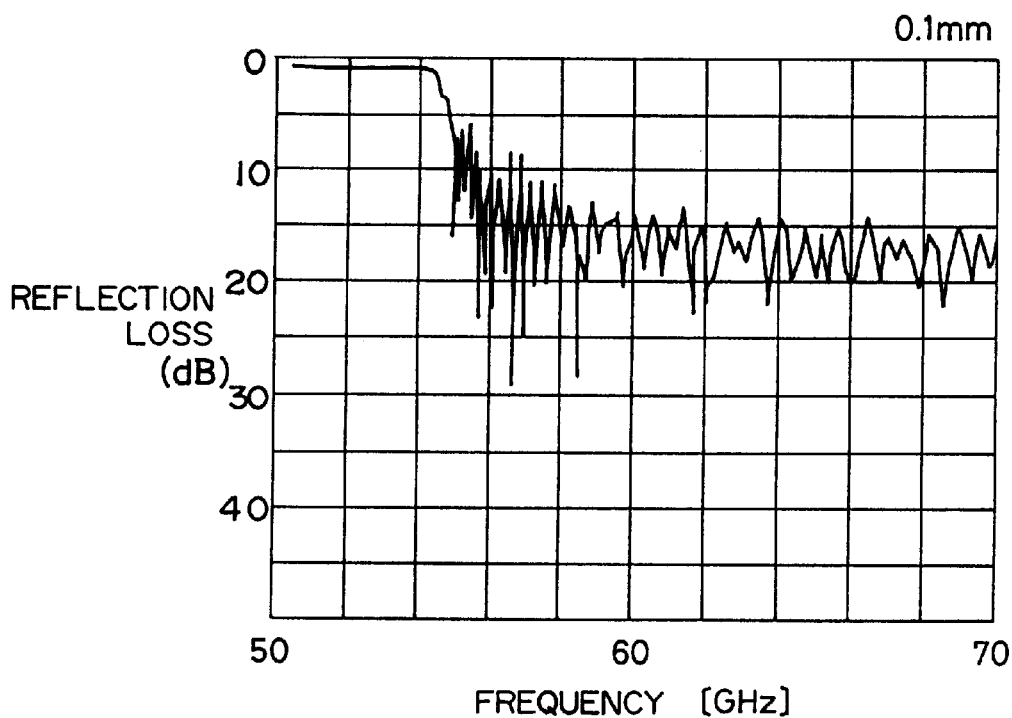
FIG. 8A is a graph which shows a reflection loss characteristic of the oscillator when the conductive plates and the dielectric strip have a gap of 0.1 mm.
Figure 8B:
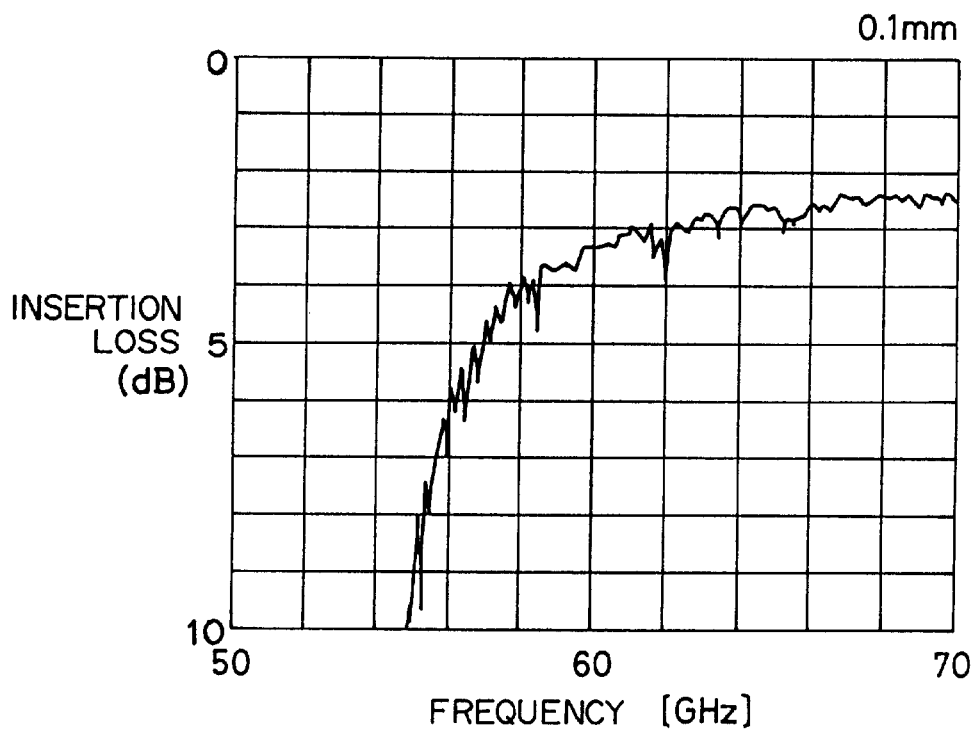
FIG. 8B is a graph which shows an insertion loss characteristic of the oscillator when the conductive plates and the dielectric strip have a gap of 0.1 mm.

In order to prove this assumption, the inventors measured the characteristics of the oscillator 1 when the conductive plates 10 and 11 and the dielectric strip 12 were cut off to have a gap d in a direction perpendicular to the electromagnetic wave propagation direction as shown in FIG. 6C. FIGS. 7A and 7B show the characteristics when the gap d was 0.1 mm. As is apparent from FIGS. 7A, 7B, 8A and 8B, even if the oscillator 1 has a gap, the reflection loss and the insertion loss of the oscillator 1 are only a little increased.

Now, this is applied to a connection between devices with a nonradiative dielectric waveguide. The case of FIGS. 7A and 7B corresponds to a case wherein mutually facing end surfaces 19b and ends 12a are in contact with each other (d=0 in FIG. 3A). The case of FIGS. 8A and 8B corresponds to a case wherein there is a gap d of 0.1 mm between the level of the end surface 19b and the end 12a of one device and the level of the end surface 19b and the end 12a of the other device (d=0.1 mm in FIG. 3A). From the result of the experiment, it can be inferred that a slight gap between the ends 12a is allowable. Accordingly, the connection between devices with a nonradiative dielectric waveguide does not require firm joining by use of a flange, and pushing between the ends 12a of the dielectric strips 12 is not necessary. Therefore, the end surface 19b of such a device has a simple structure and is small. Further, in producing an integrated circuit, mounting of devices with a nonradiative dielectric waveguide can be carried out in a simple way. Accordingly, an integrated circuit can be produced at low cost.

As described, the oscillator 1 can be produced and can be evaluated by use of a measuring jig for the oscillator 1 separately. Then, the oscillator 1 as produced and evaluated is mounted as a part of an integrated circuit, and if necessary, the oscillator 1 can be dismounted from the integrated circuit separately. Thus, the oscillator 1 is easy to handle and is suited for mass production.

Further, in order to estimate the characteristics in a case wherein the ends 12a of the dielectric strips 12 of two devices with a nonradiative dielectric waveguide are slightly protruded from the respective end surfaces 19b and are put into contact with each other, the inventors conducted an experiment in the following way. The conductive plates 10 and 11 and the dielectric strip 12 were cut off perpendicularly to the electromagnetic wave propagation direction. Then, the cut ends of the dielectric strip 12 were put into contact again, while the conductive plates 10 and 11 were rearranged to have a gap d between the respective cut ends. In this state, the characteristics of the oscillator 1 were measured.

Figure 9A:
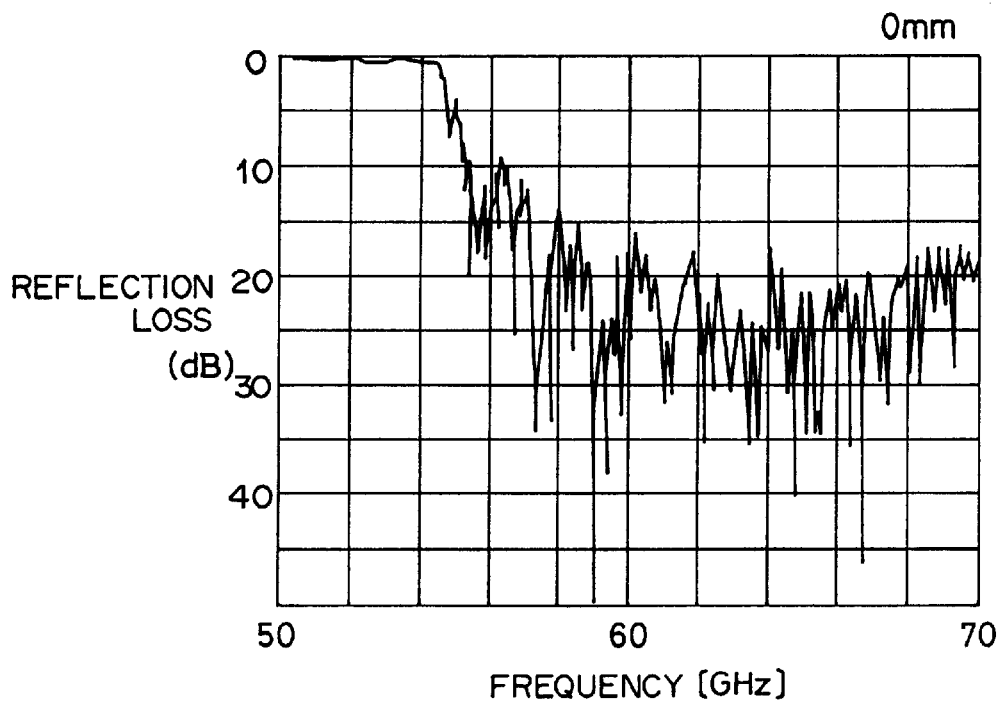
FIG. 9A is a graph which shows a reflection loss characteristic of the oscillator when the conductive plates and the dielectric strip have a gap of 0.
Figure 9B:
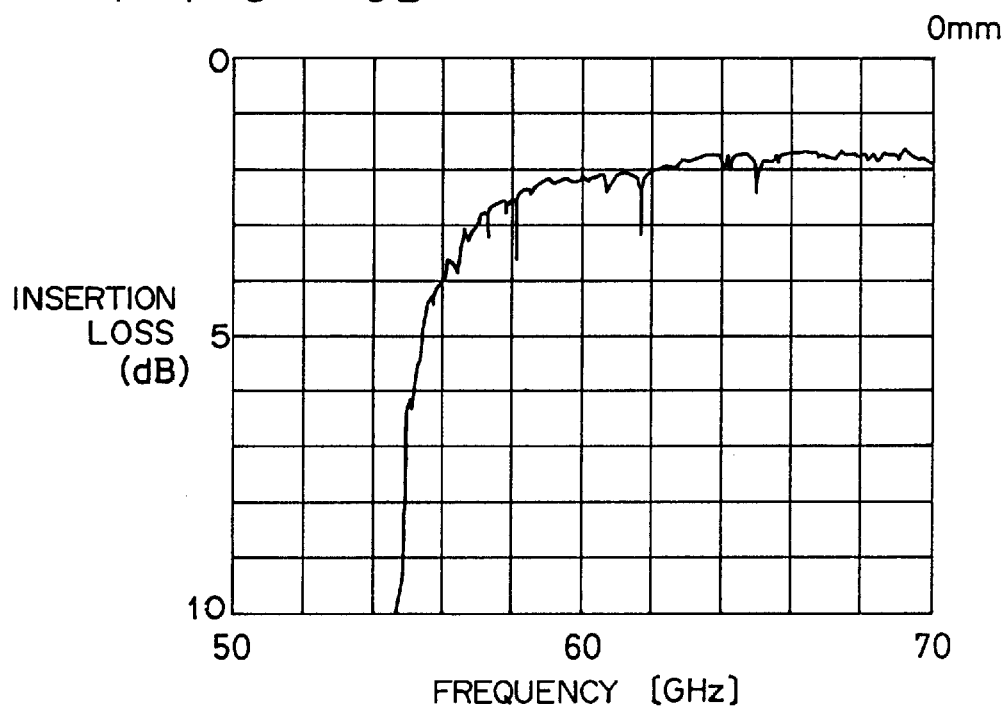
FIG. 9B is a graph which shows an insertion loss characteristic of the oscillator when the conductive plates and the dielectric strip have a gap of 0.

FIGS. 9A and 9B show the characteristics when the gap d was 0, and more specifically when the cut ends of the dielectric strip 12 and the cut ends of the conductive plates 10 and 11 were joined again. FIGS. 10A and 10B show the characteristics when the gap d was 0.1 mm, and more specifically when the cut ends of the dielectric strip 12 were protruded from the respective cut ends of the conductive plates 10 and 11 by 0.05 mm and were put into contact with each other. FIGS. 11A and 11B show the characteristics when the gap d was 0.2 mm, and more specifically when the cut ends of the dielectric strip 12 were protruded from the respective cut ends of the conductive plates 10 and 11 by 0.1 mm and were put into contact with each other.

As is apparent from FIGS. 9A, 9B, 10A, 10B, 11A and 11B, even if there is a gap d between the conductive plates 10 and 11, the reflection loss and the insertion loss of the oscillator 1 hardly change as long as the cut ends of the dielectric strip 12 are in contact with each other.

Figure 12A:
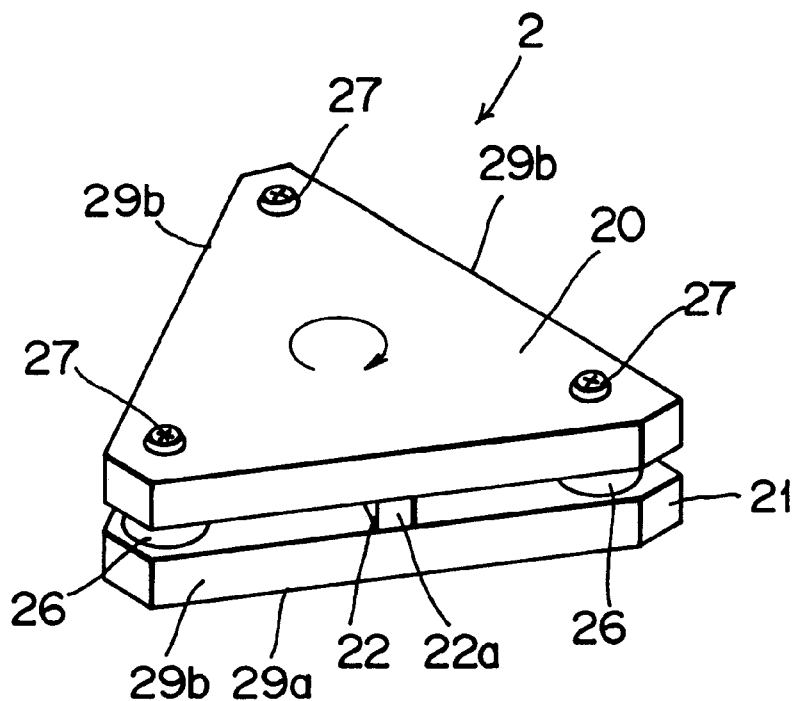
FIG. 12A is a perspective view of a circulator which is another embodiment of the present invention.
Figure 12B:
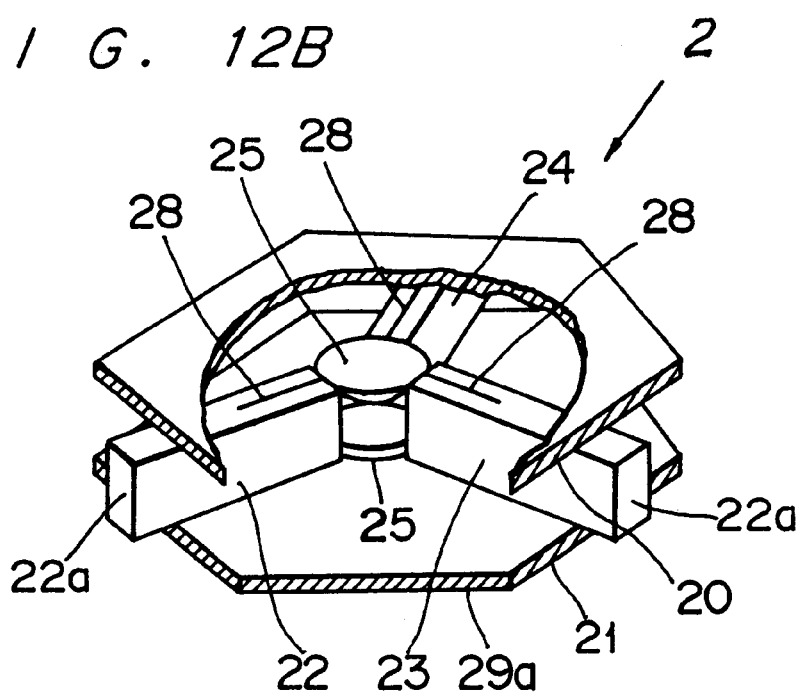
FIG. 12B is a partially cutaway perspective view of the circulator of FIG. 12A.

FIGS. 12A and 12B show the structure of a circulator 2 which is another embodiment of the present invention. The circulator 2 is used in an integrated circuit which operates in a millimeter wave band, for example, in a high-frequency section of an FM-CW radar.

The circulator 2 has a couple of triangular conductive plates 20 and 21, and between the conductive plates 20 and 21, there are provided three dielectric strips 22, 23 and 24, two ferrite discs 25 as best seen in FIG. 12B, and a magnet (not shown) for applying a direct magnetic field to the ferrite discs 25.

The conductive plates 20 and 21 are made of a conductive material such as aluminum, copper and the like. Between the conductive plates 20 and 21, spacers 26 (see FIG. 12A) for keeping the space therebetween at the height a are provided at the three corners. Each of the dielectric strips 22, 23 and 24, as an example, is made of a dielectric material with a dielectric material with a dielectric constant (∈r) of such as fluororesin and is designed to have a height of 2.25 mm and a width of 2.5 mm. Further, each of the dielectric strips 22, 23 and 24 is provided with a mode suppressor 28 near the ferrite discs 25 as best seen in FIG. 12B. Tapped holes (not shown) are made in the conductive plates 20 and 21 at the respective three corners such that the tapped holes communicate with the spacers 26. By tightening screws 27 (see FIG. 12A) into the tapped holes, the dielectric strips 22, 23 and 24, the ferrite discs 25 and the magnet are fixed between the conductive plates 20 and 21.

The conductive plate 21 has a plane mounting surface 29a on the lower side. On the three end surfaces 29b (see FIG. 12A) of the laminated conductive plates 20 and 21, respective ends 22a of the dielectric strips 22, 23 and 24 show, and the end surfaces 29b are vertical to directions in which a high-frequency electromagnetic wave which is inputted or outputted through the ends 22a of the dielectric strips 22, 23 and 24 travels.

The dielectric strips 22, 23 and 24 are positioned between the conductive plates 20 and 21 in one of the ways illustrated in FIGS. 2A, 2B, 2C and 2D. The ends 22a of the dielectric strips 22, 23 and 24 have either one of the configurations shown in FIGS. 3A, 3B and 3C, and in connecting the dielectric strips 22, 23 and 24 to dielectric strips 12 of other devices, the ends 22a are engaged with ends 12a of the dielectric strips 12.

Next, the action of the circulator 2 is described with respect to FIGS. 12A, 12B. For example, when the end 22a of the dielectric strip 22 is used as an input port of an electromagnetic wave, because of the ferrite discs 25 impressed with a dielectric magnetic field, the electromagnetic wave is transmitted only to the end 22a of the dielectric strip 24, not to the end 22a of the dielectric strip 23. When either of the ends 22a of the other dielectric strips 23 and 24 is used as an input port, the circulator 2 acts in the same manner.

Figure 13A:
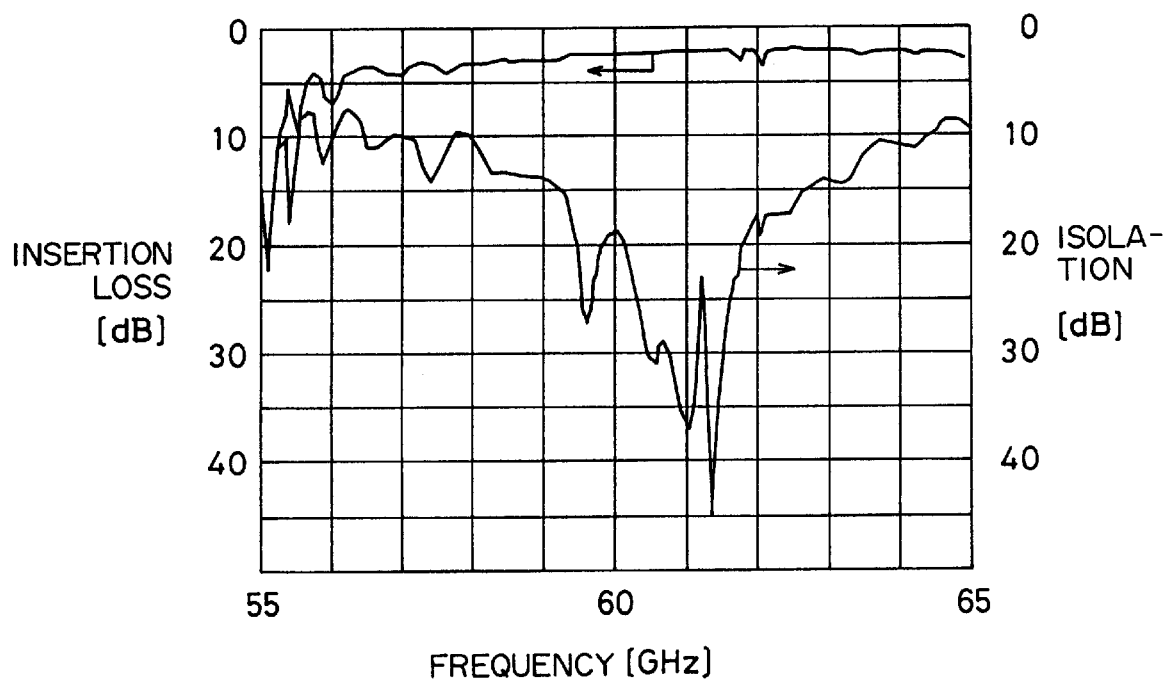
FIG. 13A is a graph which shows an insertion loss characteristic and an isolation characteristic of the circulator.
Figure 13B:
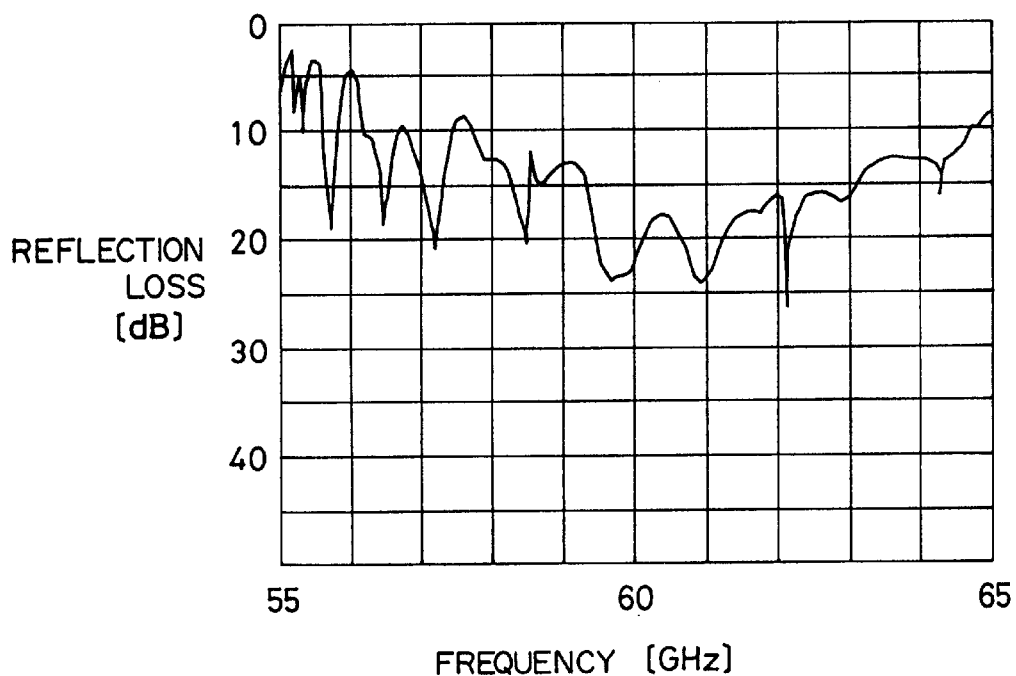
FIG. 13B is a graph which shows a reflection loss characteristic of the circulator.

The inventors evaluated the circulator 2 by using a measuring jig and a network analyzer. The evaluation was carried out while the circulator 2 is used as an isolator with one of the ends 22a of the dielectric strips 22, 23 and 24 serving as a nonreflective terminal. FIGS. 13A and 13B show the results of the evaluation. As is apparent from FIGS. 13A and 13B, the circulator 2 has a good isolation characteristic, a good insertion loss characteristic and a good reflection loss characteristic.

As described, the circulator 2 can be produced and evaluated by use of a measuring jig separately. Then, the circulator 2 as produced and measured is mounted as a part of an integrated circuit, and if necessary, the circulator 2 can be dismounted from the integrated circuit separately. Thus, the circulator 2 is easy to handle and is suited for mass production.

Although the oscillator 1 and the circulator 2 have been described as embodiments of the present invention, the present invention is applicable to other devices with a nonradiative dielectric waveguide, such as a coupler, a mixer, a nonreflective terminal, etc. These devices can be used in any integrated circuit as well as a high-frequency section of an FM-CW radar. Further, the electromagnetic wave transmitted in these devices may be a microwave as well as a millimeter wave.

Although the present invention has been described in connection with the preferred embodiments above, it is to be noted that various changes and modifications are possible to those who are skilled in the art. Such changes and modifications are to be understood as being within the scope of the present invention.

What is claimed is:

1. In combination, a pair of devices, each device including a respective nonradiative dielectric waveguide;

each said nonradiative dielectric waveguide comprising a respective pair of conductors which are arranged substantially parallel to each other and at a specified spacing, and a corresponding dielectric strip disposed between the respective pair of conductors;

each said device having an end surface which is defined by a pair of respective ends of said pair of conductors, said end surface being transverse to a direction in which an electromagnetic wave is propagated in the dielectric strip, the respective dielectric strip in the corresponding said device having an end which is substantially even with said end surface of the device;

said ends of the respective dielectric strips in the pair of devices being electromagnetically coupled to each other for propagating said electromagnetic wave between the respective devices; and one of said devices having a substantially flat mounting surface for surface-mounting said one of said devices, said flat mounting surface being distinct from said end surface, said flat mounting surface abutting said end of the corresponding one of said pair of conductors at said end surface of said one of said devices.

2. A combination as claimed in claim 1, wherein:

one of said pair of devices is a nonreciprocal circuit device; and said nonreciprocal circuit device further comprises a ferrite disc, which is adapted for receiving a direct current magnetic field so that said one of said pair of devices functions as a nonreciprocal circuit device.

3. A combination as claimed in claim 1, wherein said ends of said respective dielectric strips in said pair of devices are substantially flat.

4. A combination as claimed in claim 3, wherein said ends of said respective dielectric strips in said pair of devices are spaced apart by a gap.

5. A combination as claimed in claim 1, wherein said mounting surface is defined by one of said respective pair of conductors in said one of said devices.

6. A combination as claimed in claim 1, wherein one of said pair of devices is a high-frequency integrated circuit.

7. A combination as claimed in claim 6, wherein said one of said pair of devices is a non-reciprocal circuit device.

8. A combination as claimed in claim 1, wherein one of said pair of devices is an oscillator; and said oscillator further comprises a Gunn diode and a varactor diode.

9. A combination as claimed in claim 1, wherein in at least one of said pair of devices, the corresponding said dielectric strip is disposed in a groove which is disposed in at least one of the conductors.

10. A combination as claimed in claim 1, wherein in at least one of said pair of devices, the corresponding said dielectric strip has flanges on opposite sides thereof which are respectively in contact with the pair of conductors.

11. A device including a nonradiative dielectric waveguide, said nonradiative dielectric waveguide comprising:

a pair of conductors which are arranged substantially parallel to each other and at a specified spacing; and
   a dielectric strip which is disposed between the pair of conductors;

said device having an end surface which is defined by a pair of respective ends of said pair of conductors and said end surface being transverse to a direction in which an electromagnetic wave is propagated in the dielectric strip;

an end of said dielectric strip being substantially even with said end surface of said device for being electromagnetically coupled to another such dielectric strip in another such device for propagating an electromagnetic wave between the respective devices; and said device having a substantially flat mounting surface for surface-mounting said device, said flat mounting surface being distinct from said end surface, said flat mounting surface abutting said end of one of said pair of conductors at said end surface of said device.

12. A device as claimed in claim 11, wherein said end of said dielectric strip is substantially flat.

13. A device as claimed in claim 11, wherein said device is a high-frequency integrated circuit.

14. A device as claimed in claim 13, wherein said device is a nonreciprocal circuit device.

15. A device as claimed in claim 11, wherein said mounting surface is defined by one of said pair of conductors.

* * * * *